(12) United States Patent
Mochizuki

(10) Patent No.: US 8,463,415 B2
(45) Date of Patent: Jun. 11, 2013

(54) LOT PROCESSING START DETERMINING METHOD AND CONTROL UNIT

(75) Inventor: Hiroaki Mochizuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 455 days.

(21) Appl. No.: 12/770,016

(22) Filed: Apr. 29, 2010

(65) Prior Publication Data

US 2010/0280643 A1 Nov. 4, 2010

Related U.S. Application Data

(60) Provisional application No. 61/222,820, filed on Jul. 2, 2009.

(30) Foreign Application Priority Data

Apr. 30, 2009 (JP) ................................. 2009-111404

(51) Int. Cl.
*G06F 19/00* (2006.01)
(52) U.S. Cl.
USPC ............................................. 700/99; 700/106
(58) Field of Classification Search
USPC .................... 700/99, 100, 101, 102, 103, 106
See application file for complete search history.

(56) References Cited

U.S. PATENT DOCUMENTS

| | | | |
|---|---|---|---|
| 6,902,762 B2 | 6/2005 | Miyata | |
| 7,313,452 B2* | 12/2007 | Kobayashi et al. | 700/100 |
| 2002/0014311 A1* | 2/2002 | Tometsuka | 156/345 |
| 2003/0009256 A1* | 1/2003 | Marume et al. | 700/121 |

FOREIGN PATENT DOCUMENTS

| | | |
|---|---|---|
| JP | 7-201951 | 8/1995 |
| JP | 2002-16123 | 1/2002 |
| JP | 2002-170819 | 6/2002 |
| JP | 2003-324059 | 11/2003 |
| JP | 2007-250791 | 9/2007 |
| JP | 2007-266410 | 10/2007 |

* cited by examiner

*Primary Examiner* — Ryan Jarrett
(74) *Attorney, Agent, or Firm* — Rothwell, Figg, Ernst & Manbeck, P.C.

(57) ABSTRACT

A lot processing start determining method includes: storing, in a memory, processing conditions of each lot in a first substrate vessel and a maximum usable number of dummy substrates in a second substrate vessel; counting the used number the dummy substrates in the second substrate vessel; and calculating the number of dummy substrates required to process all substrates of a next lot in the first substrate vessel based on the processing conditions of each lot which are stored in the memory, adding the calculated number of the dummy substrates of the next lot to the counted used number of the dummy substrates, and determining whether the added value exceeds the maximum usable number of the dummy substrates stored in the memory. The method further includes prohibiting start of processing the next lot when the added value is determined to exceed the maximum usable number of the dummy substrate.

20 Claims, 6 Drawing Sheets

FIG. 3A

|  | PM1 | PM2 | PM3 | PM4 |
|---|---|---|---|---|
| NUMBER OF USING PM UNTIL CLEANING | 5 SHEETS | 5 SHEETS | 5 SHEETS | 5 SHEETS |
| TOTAL USED NUMBER OF PM | 4 SHEETS | 4 SHEETS | 4 SHEETS | 4 SHEETS |
| REQUIRED NUMBER OF SEASONING WAFERS | 1 SHEET | 1 SHEET | 1 SHEET | 1 SHEET |
| TRANSFER ROUTE | PM1 or PM2 or PM3 or PM4 ||||

FIG. 3B

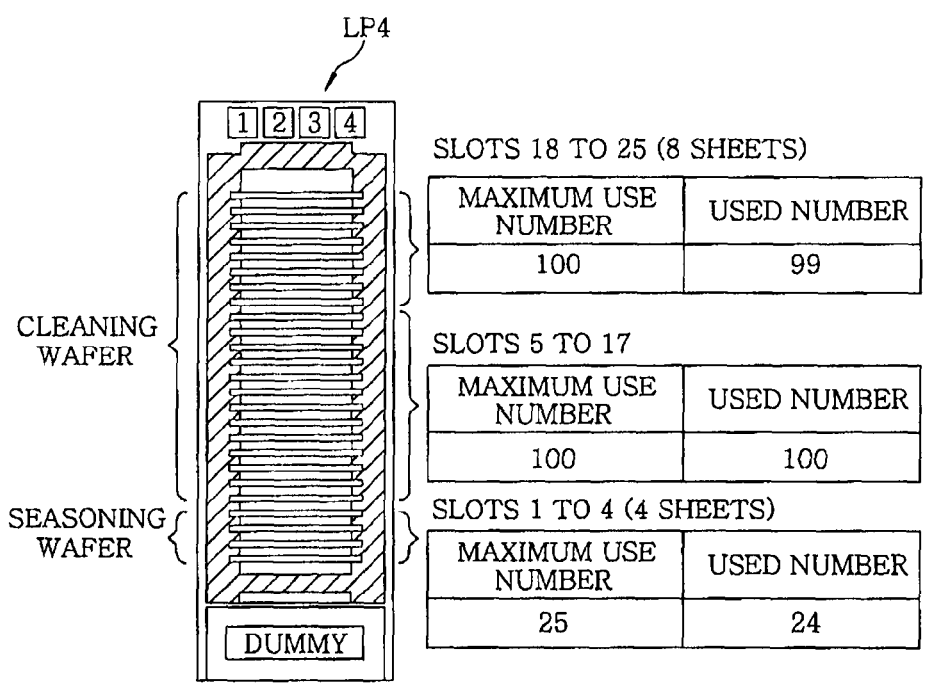

SLOTS 18 TO 25 (8 SHEETS)

| MAXIMUM USE NUMBER | USED NUMBER |
|---|---|
| 100 | 99 |

SLOTS 5 TO 17

| MAXIMUM USE NUMBER | USED NUMBER |
|---|---|
| 100 | 100 |

SLOTS 1 TO 4 (4 SHEETS)

| MAXIMUM USE NUMBER | USED NUMBER |
|---|---|
| 25 | 24 |

FIG. 3C

| PM1 | ⊘○⊘○○○○○⊘○○○○○⊘○○○○○⊘○○○○⊘○ |
|---|---|
| PM2 | ⊘○⊘ ERROR OCCURS OR THE LIKE |
| PM3 | ⊘○⊘ ERROR OCCURS OR THE LIKE |
| PM4 | ⊘○⊘ ERROR OCCURS OR THE LIKE |

⊘ SEASONING WAFER
⊘ CLEANING WAFER

FIG. 4A
|  | PM1 | PM2 | PM3 | PM4 |
|---|---|---|---|---|
| NUMBER OF USING PM UNTIL CLEANING | 5 SHEETS | 5 SHEETS | 5 SHEETS | 5 SHEETS |
| TOTAL USED NUMBER OF PM | 4 SHEETS | 4 SHEETS | 4 SHEETS | 4 SHEETS |
| REQUIRED NUMBER OF SEASONING WAFERS | 1 SHEET | 1 SHEET | 1 SHEET | 1 SHEET |
| TRANSFER ROUTE | LOT-A: PM1 OR PM2 / LOT-B: PM3 OR PM4 ||||
FIG. 4B
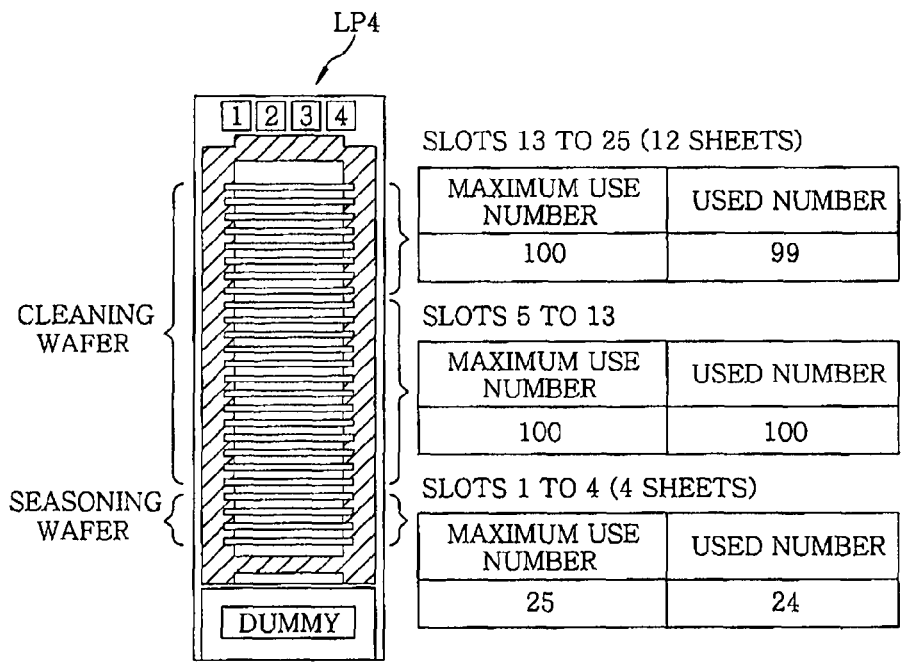
SLOTS 13 TO 25 (12 SHEETS)
| MAXIMUM USE NUMBER | USED NUMBER |
|---|---|
| 100 | 99 |
SLOTS 5 TO 13
| MAXIMUM USE NUMBER | USED NUMBER |
|---|---|
| 100 | 100 |
SLOTS 1 TO 4 (4 SHEETS)
| MAXIMUM USE NUMBER | USED NUMBER |
|---|---|
| 25 | 24 |
FIG. 4C
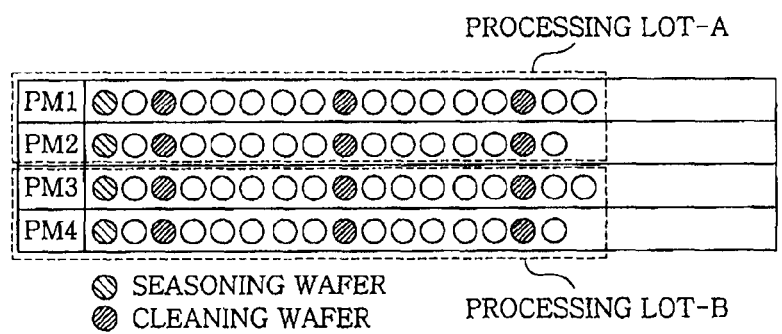

FIG.5A

|  | PM1 | PM2 | PM3 | PM4 |
|---|---|---|---|---|
| NUMBER OF USING PM UNTIL CLEANING | 5 SHEETS | 5 SHEETS | 5 SHEETS | 5 SHEETS |
| TOTAL USED NUMBER OF PM | 4 SHEETS | 4 SHEETS | 4 SHEETS | 4 SHEETS |
| REQUIRED NUMBER OF SEASONING WAFERS | 1 SHEET | 1 SHEET | 1 SHEET | 1 SHEET |
| TRANSFER ROUTE | PM1 OR PM2 OR PM3 OR PM4 | | | |

FIG.5B

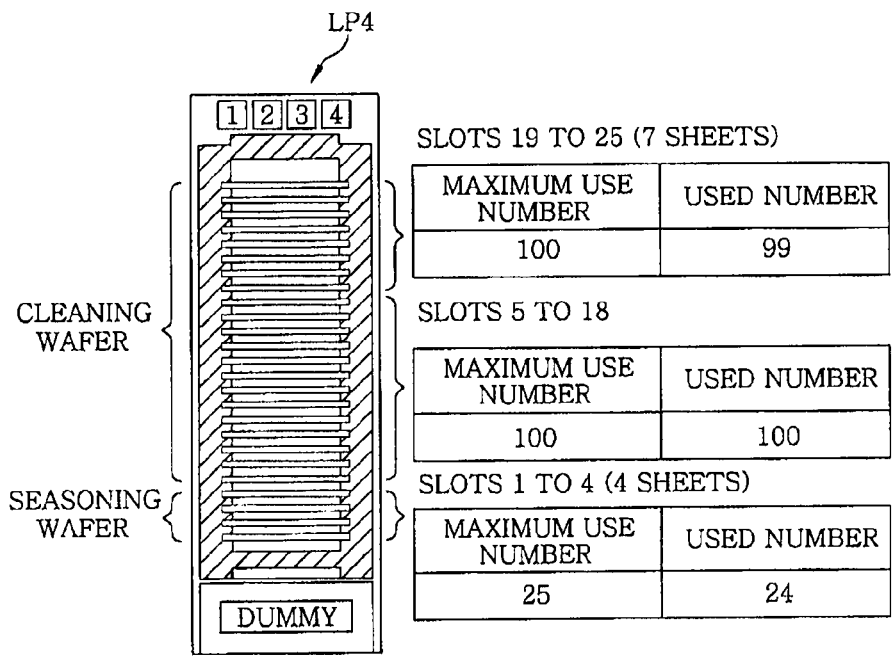

SLOTS 19 TO 25 (7 SHEETS)

| MAXIMUM USE NUMBER | USED NUMBER |
|---|---|
| 100 | 99 |

SLOTS 5 TO 18

| MAXIMUM USE NUMBER | USED NUMBER |
|---|---|
| 100 | 100 |

SLOTS 1 TO 4 (4 SHEETS)

| MAXIMUM USE NUMBER | USED NUMBER |
|---|---|
| 25 | 24 |

FIG.5C

| PM1 | ⊗○⊘○○○○○⊘○○○○○○⊘○○○○○○○⊘○○○○○⊘○ |
|---|---|
| PM2 | ⊗○⊘ ERROR OCCURS OR THE LIKE |
| PM3 | ⊗○⊘ ERROR OCCURS OR THE LIKE |
| PM4 | ⊗○⊘ ERROR OCCURS OR THE LIKE |

⊗ CLEANING WAFER
⊘ SEASONING WAFER

FIG.6A
|  | PM1 | PM2 | PM3 | PM4 |
|---|---|---|---|---|
| NUMBER OF USING PM UNTIL CLEANING | 5 SHEETS | 5 SHEETS | 5 SHEETS | 5 SHEETS |
| TOTAL USED NUMBER OF PM | 4 SHEETS | 4 SHEETS | 4 SHEETS | 4 SHEETS |
| REQUIRED NUMBER OF SEASONING WAFERS | 1 SHEET | 1 SHEET | 1 SHEET | 1 SHEET |
| TRANSFER ROUTE | LOT-C: PM1 OR PM2 OR PM3 / LOT-D: PM3 OR PM4 ||||
FIG.6B
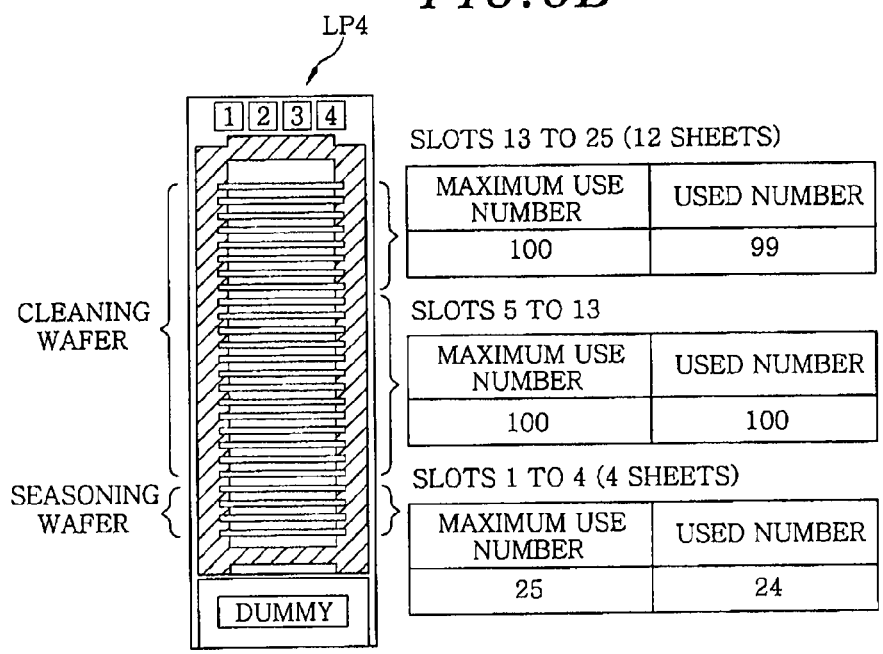
FIG.6C
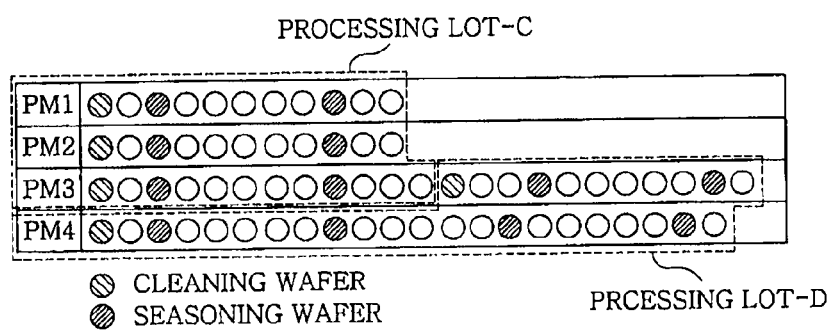

LOT PROCESSING START DETERMINING METHOD AND CONTROL UNIT

FIELD OF THE INVENTION

The present invention relates to a lot processing start determining method and a control unit for controlling a substrate processing system.

BACKGROUND OF THE INVENTION

In a substrate processing system, an atmospheric transfer chamber is provided between a substrate receiving vessel for receiving substrates and a substrate processing chamber maintained in a predetermined vacuum state, and a substrate held by an arm or the like is transferred between the substrate processing chamber and the substrate receiving vessel. In the substrate processing chamber, predetermined processing, e.g., reactive ion etching (RIE) or the like, is carried out. The substrate receiving vessel is referred to as, e.g., a carrier or the like.

In the processing chamber, a seasoning process or a cleaning process is performed before, after, or during processing product wafers. The timing for performing a cleaning process is generally set in a recipe. Therefore, a control unit for controlling the substrate processing system performs a cleaning process or a seasoning process by using a dummy wafer (e.g., a cleaning wafer or a seasoning wafer) based on the recipe before, after, or during processing of product wafers.

Dummy wafers are received in a dummy wafer carrier. Meanwhile, product wafers on which actual processing such as etching or the like is performed are received in a product wafer carrier.

The cleaning process is performed to remove deposits in a processing chamber by using a dummy wafer (herein, a cleaning wafer) after a certain number of product wafers are processed. Japanese Patent Application Publication No. 2007-250791 describes a unit for performing proper cleaning in accordance with processing types.

The seasoning process is performed to control a temperature in the processing chamber or a state of deposits adhered to an inner wall of the processing chamber by using a dummy wafer (herein, a seasoning wafer) after the cleaning process. Japanese Patent Application Publication No. 2007-266410 describes a seasoning process for controlling a state in the processing chamber based on a temperature condition.

A cleaning wafer or a seasoning wafer is repeatedly used during a lot processing of product wafers. Since a dummy wafer is repeatedly plasma-processed, it is damaged by consumption, or deposits excessively adhered to the surface of the dummy wafer causes contamination of the chamber. To that end, in general, the number of using dummy wafer is limited.

Whenever each dummy wafer is used, the used number of the dummy wafer is counted. If at least one of dummy wafers in a dummy wafer carrier reaches the limited use number, the corresponding wafer is replaced with a new dummy wafer, or the dummy wafer carrier where the corresponding dummy wafer is received is replaced with a new dummy wafer carrier where unused dummy wafers are received. When the dummy wafer carrier is replaced with a new dummy wafer carrier, all of dummy wafers are destroyed even if usable dummy wafers remain in the dummy wafer carrier.

Since, however, one lot includes a plurality of, e.g., 25, product wafers, if dummy processing is required whenever five product wafers are processed, for example, a plurality of dummy wafers is needed until the 25 product wafers of one lot are all processed. Further, the required number of dummy wafers varies depending on a wafer transfer route or a cleaning frequency. When the used number of dummy wafers in the dummy wafer carrier reaches the limited use number before all the product wafers in one lot are processed, the lot processing needs to be stopped in order to replace the dummy wafers or the dummy wafer carrier.

If such circumstances occur during processing of product wafers of one lot, a temperature in the processing chamber or the like is changed before the replacement is completed. Accordingly, the variation in the processing of product wafers in the corresponding lot increases compared to that in conventional lot processing, and this may decrease a production yield.

SUMMARY OF THE INVENTION

In view of the above, the present invention provides a method for prohibiting start of lot processing and a control unit therefor. In this method, the number of dummy wafers used in a dummy wafer carrier is counted, and a number of using dummy wafers required to process product wafers of a next lot in a product wafer carrier is calculated based on processing conditions and the number of the product wafers of the next lot. This calculation is performed before the lot processing is started, and the calculation result is added to the counted number of the dummy wafers used in the dummy wafer carrier. When the added result exceeds an actual maximum usable number of the dummy wafers, the start of the corresponding lot processing is prohibited.

In accordance with an aspect of the present invention, there is provided a lot processing start determining method to be applied in a substrate processing system including a substrate processing chamber for performing desired processing on a substrate provided therein, a first substrate receiving vessel for receiving product substrates of each lot and a second substrate receiving vessel for receiving dummy substrates.

The method includes: storing, in a memory, processing conditions of each lot in the first substrate receiving vessel and a maximum usable number of dummy substrates in the second substrate receiving vessel; counting a of the used number the dummy substrates in the second substrate receiving vessel; calculating the number of dummy substrates required to process all the product substrates of a next lot in the first substrate receiving vessel based on the processing conditions of each lot which are stored in the memory, adding the calculated number of the dummy substrates of the next lot to the counted used number of the dummy substrates, and determining whether the added value exceeds the maximum usable number of the dummy substrates stored in the memory; and prohibiting start of processing the next lot when the added value is determined to exceed the maximum usable number of the dummy substrate.

The method may further include: replacing, when the start of the processing of the next lot is prohibited, the second substrate receiving vessel or the dummy substrates in the second substrate receiving vessel.

When the start of the processing of the next lot is prohibited, an alarm indicating prohibition of the start of the processing of the next lot may be displayed on a monitor.

When processing of a current lot is completed, the number of dummy substrates required to process all the product wafers of the next lot is preferably added to the counted used number of the dummy substrates and whether the added value exceeds the maximum usable number of the dummy substrates stored in the memory is determined again, and when the added value is determined not to exceed the maximum usable number of the dummy substrates, the start of the processing of the next lot is allowed.

When the start of the processing of the next lot is prohibited, the number of the dummy substrates required to process a waiting lot following the next lot may be added to the counted used number of the dummy substrates, and whether the added value exceeds the maximum usable number of the dummy substrates stored in the memory is determined, and when the added value is determined not to exceed the maximum usable number of the dummy substrates, the processing of the waiting lot is started prior to the processing of the next lot.

In said counting, the maximum usable number of dummy substrates required to process all the product substrates in a next lot is preferably added to the counted used number of the dummy substrates.

The dummy substrates preferably include at least one of cleaning substrates or seasoning substrate.

In accordance with another aspect of the present invention, there is provided a control unit for controlling a substrate processing system including a substrate processing chamber for performing desired processing on a substrate, a first substrate receiving vessel for receiving product substrates of each lot, and a second substrate receiving vessel for receiving dummy substrates.

The control unit performs operations including: storing, in a memory, processing conditions of each lot in the first substrate receiving vessel and a maximum usable number of dummy substrates in the second substrate receiving vessel; and counting a number of using the dummy substrates in the second substrate receiving vessel.

The control unit performs further operations including: calculating the number of dummy substrates required to process all the product substrates of a next lot in the first substrate receiving vessel based on the processing conditions of each lot which are stored in the memory, adding the calculated number of the dummy substrates of the next lot to the counted used number of the dummy substrates, and determining whether the added value exceeds the maximum usable number of the dummy substrates stored in the memory; and prohibiting, when the added value is determined to exceed the maximum usable number of the dummy substrate, start of processing of the next lot.

BRIEF DESCRIPTION OF THE DRAWINGS

The objects and features of the present invention will become apparent from the following description of embodiments, given in conjunction with the accompanying drawings, in which:

FIGS. 3A to 3C illustrate an example of a case of allowing start of lot processing;

FIGS. 4A to 4C depict another example of the case of allowing start of lot processing;

FIGS. 5A to 5C present an example of a case of prohibiting start of lot processing; and FIGS. 6A to 6C represent another example of the case of prohibiting start of lot processing.

DETAILED DESCRIPTION OF THE EMBODIMENT

Figure 1:
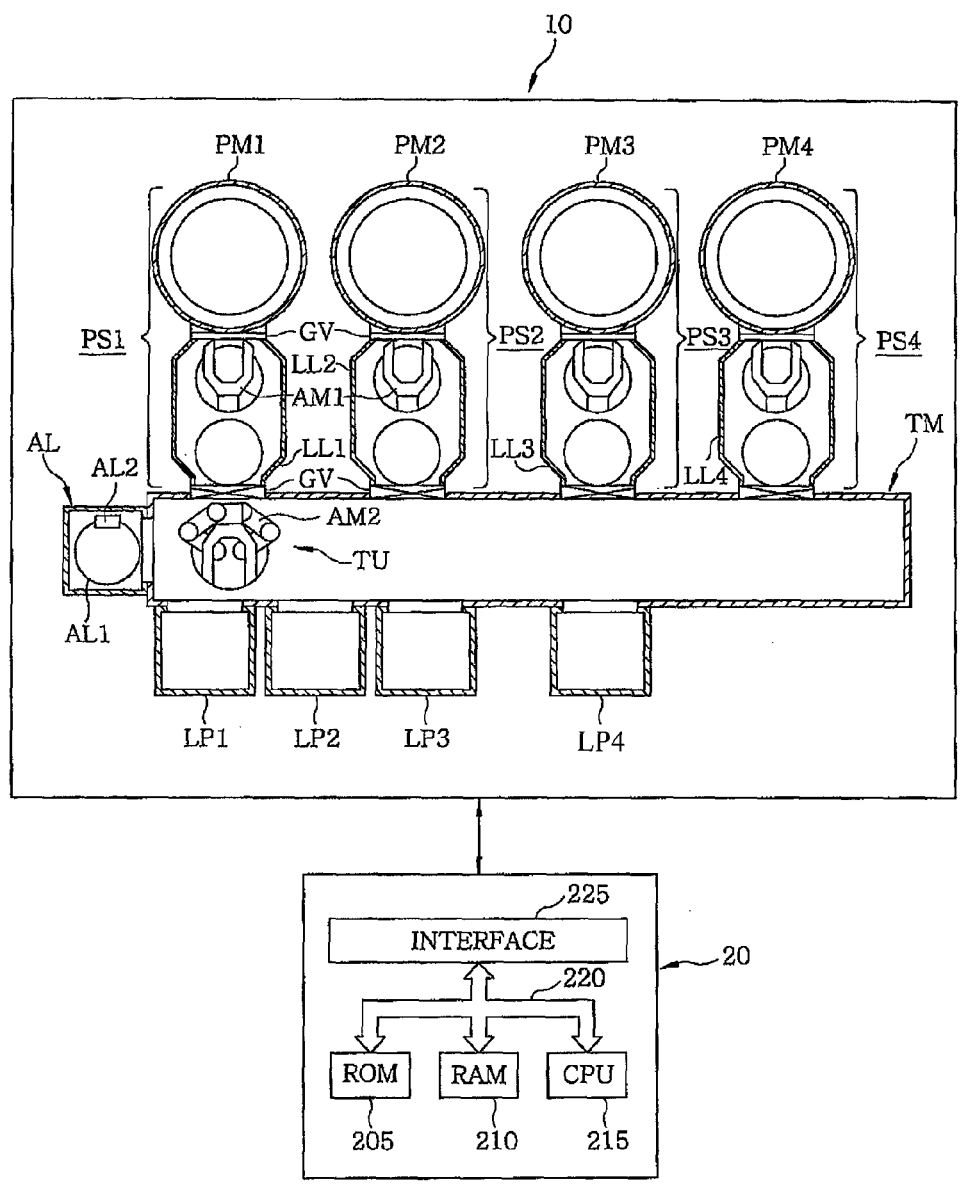
FIG. 1 shows a substrate processing system and a control unit in accordance with an embodiment of the present invention.

The embodiments of the present invention will be described with reference to the accompanying drawings which form a part hereof. Further, like reference numerals will be given to like parts having substantially the same functions throughout the specification and the drawings, and redundant description thereof will be omitted.

First of all, hardware configurations of a substrate processing system 10 and a control unit 20 in accordance with an embodiment of the present invention will be described with reference to FIG. 1.

[Hardware Configuration of Substrate Processing System]

The substrate processing system 10 includes first to fourth process ships PS1 to PS4, an atmospheric transfer chamber TM, a position alignment mechanism AL, product wafer carriers LP1 to LP3 serving as a first substrate receiving vessel for receiving product wafers of each lot, and a dummy wafer carrier LP4 serving as a second substrate receiving vessel for receiving dummy wafers.

The first process ship PS1 has a substrate processing chamber PM1 and a load-lock chamber LL1. The substrate processing chamber PM1 performs desired processing on a wafer in a predetermined vacuum state. The load-lock chamber LL1 is provided between the atmospheric transfer chamber TM and the substrate processing chamber PM1, and a wafer held by an arm AM1 is transferred between an atmospheric space and a vacuum space in a predetermined depressurized state.

To be specific, the arm AM1 stands by in the load-lock chamber LL1 while holding a next wafer W to be processed. When plasma processing for a previous wafer W is completed in the substrate processing chamber PM1, the arm AM1 exchanges the next wafer W with the previous wafer W. That is the arm AM1 transfers the next wafer W to the substrate processing chamber PM1 and the previous wafer W to the atmospheric transfer chamber TM. Gate valves GV are provided between the corresponding chambers, i.e., the substrate processing chamber PM1 and the load-lock chamber LL1 and between the load-lock chamber LL1 and the atmospheric transfer chamber TM to maintain the chambers airtight. In the same manner, the second to the fourth process ships PS2 to PS4 have substrate processing chambers PM2 to PM4 and load-lock chambers LL2 to LL4, and gate valves GV are provided at connection portions between the corresponding chambers.

In the substrate processing chambers PM1 to PM4, a RIE (Reactive Ion Etching) process is performed on a wafer by using a plasma, or a COR (Chemical Oxide Removal) process, a PHT (Post Heat Treatment) process or the like is performed on the wafer that has been subjected to the RIE process. Moreover, a film forming process, a sputtering process or the like may be carried out in each of the substrate processing chambers PM1 to PM4.

The atmospheric transfer chamber TM connects the product wafer carriers LP1 to LP3 and the dummy wafer carrier LP4 with the substrate processing chambers PM1 to PM4 via the load-lock chambers LL1 to LL4. An arm AM2 or a substrate transfer unit TU including a rail (not shown) or the like is provided in the atmospheric transfer chamber TM and transfers wafers between the substrate processing chambers PM1 to PM4 and the product wafer carriers LP1 to LP3 and the dummy wafer carrier LP4.

The position alignment mechanism AL performs orientation alignment of the wafer by detecting a state of a peripheral portion of the wafer by an optical sensor AL2 while rotating a rotatable table AL1 on which the wafer is mounted.

The product wafer carriers LP1 to LP3 and the dummy wafer carrier LP4 are mounted on cassette stages (not shown) disposed on a sidewall of the atmospheric transfer chamber TM. Each of the product wafer carriers LP1 to LP3 includes a maximum of 25 wafers arranged vertically. The dummy wafer carrier LP4 includes a maximum of 25 dummy wafers arranged vertically. The dummy wafers and the product wafers are not received together. As described above, the dummy wafers include at least one of cleaning wafers and seasoning wafers. The dummy wafers can be used repeatedly. The limit of using the dummy wafers may be set to a maximum usable number of the dummy wafers or a maximum processing time for processing the dummy wafers in the substrate processing chamber.

The product wafers are examples of product substrates, and the dummy wafers are examples of dummy substrates. The product substrates and the dummy substrates may have a circular shape or a square shape.

[Hardware Configuration of Control Unit]

Hereinafter, a hardware configuration of the control unit 20 will be explained. The control unit 20 has an ROM (Read Only Memory) 205, an RAM (Random Access Memory) 210, a CPU (Central Processing Unit) 215, a bus 220 and an interface 225.

The ROM 205 stores therein a basic program executed by the control unit 20, a program executed in an abnormal state and the like. The RAM 210 stores therein various programs, recipes, parameters and the like. The maximum usable number of dummy wafers is determined by an operator by setting parameters in advance.

The recipes used for an etching process include a sequence of etching product wafers or dummy wafers, and etching processing conditions (e.g., a set temperature and the like).

The RAM 210 stores lot numbers and wafer numbers of wafers received in the product wafer carriers LP1 to LP3. The RAM 210 also stores the counted number of the dummy wafer carrier LP4 used or the like. Moreover, the ROM 201 and the RAM 210 are examples of a memory, and may be replaced by an EEPROM, an optical disk, a magneto-optical disk, a hard disk or the like.

The CPU 215 controls processing of the product wafers in the product wafer carriers LP1 to LP3 and the transfer of the wafers. Further, the CPU 215 manages the usage status of the dummy wafers used in the dummy wafer carrier LP4. When necessary, the CPU 215 prohibits start of the next lot processing so that the lot processing can be prevented from being stopped to replace the dummy wafer carrier or the dummy wafers.

The bus 220 is a route for sending and receiving information between devices. The interface 225 allows an operator to input parameter values through an input device such as a keyboard or the like (not shown) and outputs required information to a monitor or a speaker (both not shown). For example, when the start of the next lot processing is prohibited by a lot processing start determining process to be described later, an alarm indicating the prohibition of the start of the next lot processing is displayed on the monitor. Further, the interface 225 receives and transmits data required for operating various actuators of the substrate processing system 10.

[Operation of Control Unit]

Figure 2:
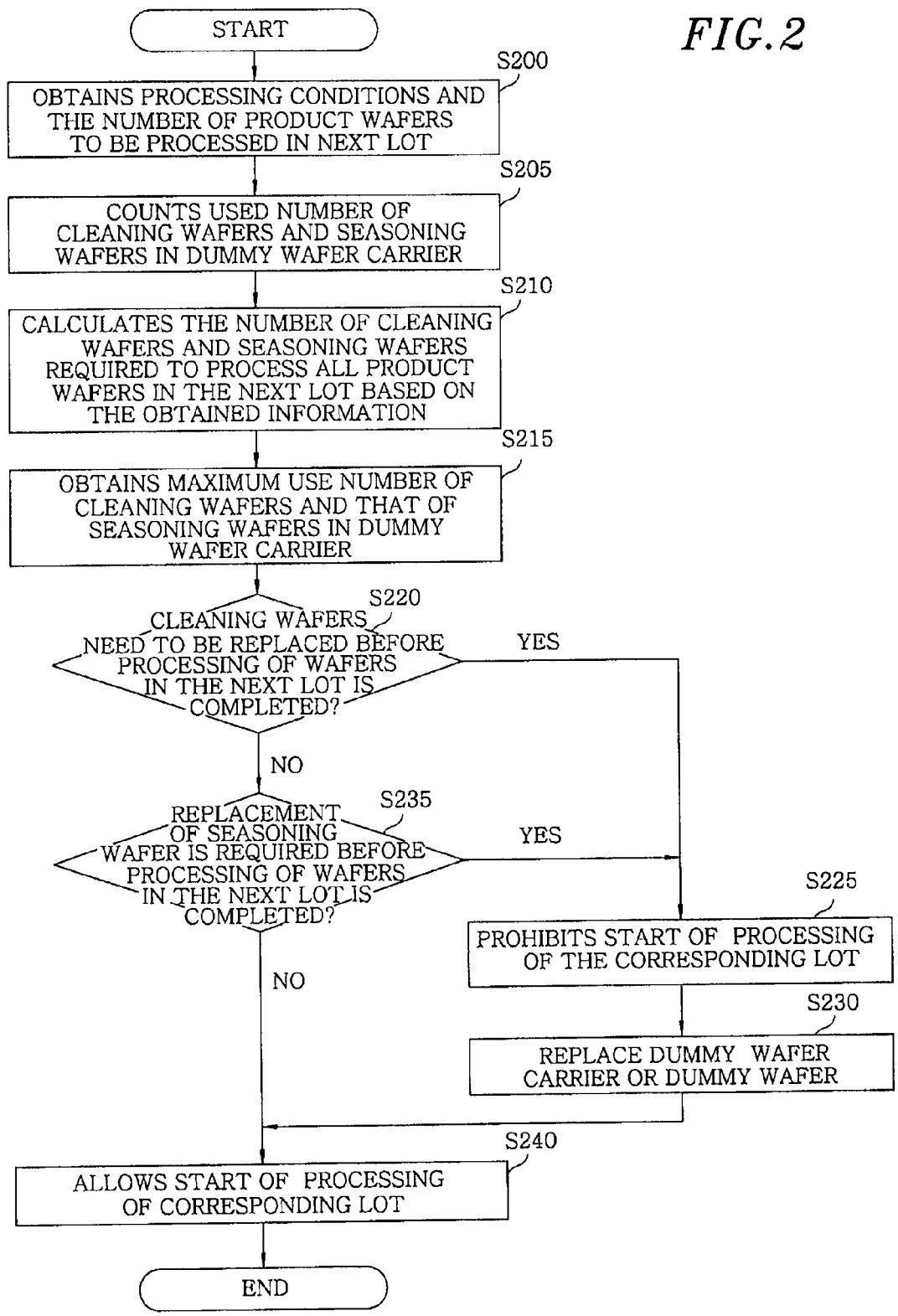
FIG. 2 is a flowchart describing a lot processing start determining process.

Hereinafter, an operation of the control unit 20 will be described with reference to FIGS. 2 to 6C. FIG. 2 is a flowchart showing a lot processing start determining process executed by the control unit 20.

FIGS. 3A, 3B, 4A, 4B, 5A, 5B, 6A and 6B illustrate setting states of recipes or parameters used in the above process and a state in the dummy wafer carrier LP4. FIGS. 3C, 4C, 5C and 6C depict calculation results to be described later.

Since items described in FIGS. 3A to 6C are the same, they will be explained with reference to FIGS. 3A to 3C. The first item in FIG. 3A, i.e., of the number of using PM (i.e., the substrate processing chamber) which is allowed until cleaning is needed is set to, e.g., five for each of the substrate processing chambers PM1 to PM4. This item indicates that a cleaning process is performed by using a cleaning wafer whenever five product wafers are processed in each substrate processing chamber PM. This item is set in a parameter in advance by an operator's input.

The second item in FIG. 3A, i.e., a total used number of PM, represents a counted number of product wafers processed in each substrate processing chamber PM after the cleaning process. The total used number of PM is stored in a memory such as the RAM 210 or the like. In this case, the number of product wafers processed in each substrate processing chamber PM after the cleaning process is four. Therefore, the cleaning process using a cleaning wafer needs to be performed after one product wafer is processed in each substrate processing chamber PM.

The third item in FIG. 3A, i.e., the required number of seasoning wafers, indicates the number of seasoning wafers required for a seasoning process performed before starting the lot processing. Herein, one seasoning wafer is required for each substrate processing chamber PM. This item is set in a system recipe.

The last item in FIG. 3A, i.e., a transfer route, represents a product wafer transfer method. Herein, there is employed an OR transfer of a substrate to the substrate processing chambers PM1 to PM4, i.e., a method for transferring a substrate to one available substrate processing chamber among the substrate processing chambers PM1 to PM4. This item is set in the system recipe.

FIG. 3B shows a state of the dummy wafer carrier LP4. Four seasoning wafers are received in slots 1 to 4. Twenty-one dummy wafers are received in slots 5 to 25.

Each of the four seasoning wafers can be used, e.g., times at maximum, and the used number of the four seasoning wafers is 24 at current time. Hence, the seasoning wafers in the slots 1 to 4 can be used one more time, i.e., four times in total.

Each of the cleaning wafers can be used, e.g., 100 times at maximum. Herein, the cleaning wafers in the slots 5 to 17 have reached its maximum usable number of 100. The cleaning wafers in the slots 18 to 25 have been used 99 times, and thus can be used one more time, i.e., eight times in total.

As described above, the lot processing conditions of the product wafers in the product wafer carrier and the maximum usable number of the dummy wafers in the dummy wafer carrier are stored in the memory before the lot processing start determining process (storing step).

(Lot Processing Start Determining Process)

In order to perform the lot processing start determining process in FIG. 2, the control unit 20 obtains, at step S200, processing conditions of a next lot and the number of product wafers to be processed in the next lot from various parameters or system recipes stored in the memory. The processing conditions include the number of using PM which is allowed until cleaning is needed, the total used number of PM, the required number of seasoning wafers, the transfer route and the like.

Next, at step S205, the control unit 20 counts the used number of each of the dummy wafers (cleaning wafers and seasoning wafers) in the dummy wafer carrier (counting step).

Thereafter, at step S210, the control unit 20 calculates the number of cleaning wafers and seasoning wafers required to process all the product wafers in the next lot based on the obtained information.

Then, at step S215, the control unit 20 obtains the maximum usable number of the cleaning wafers and that of the seasoning wafers in the dummy wafer carrier which are stored in the memory.

Next, at step S220, the control unit 20 determines whether or not the cleaning wafers need to be replaced before the processing of the wafers in the next lot is completed. To be specific, the control unit 20 adds the calculated number of cleaning wafers required for the next lot to the counted number of the cleaning wafers used, and determines whether or not the added valued exceeds the maximum usable number of the cleaning wafers (determining step).

If the result value exceeds the maximum usable number of the cleaning wafers, it is required to replace the cleaning wafers or the dummy wafer carrier during the next lot processing. Therefore, the process proceeds to step S225, and the control unit 20 prohibits start of processing of the corresponding lot (prohibiting step).

Thereafter, the process proceeds to step S230, and the dummy wafer carrier is replaced or the cleaning wafers in the dummy wafer carrier which have reached the maximum usable number are replaced (replacing step). At step 240, the control unit 20 allows the start of the processing of the corresponding lot (processing start allowing step), and this process is completed.

On the other hand, if the result value does not exceed the maximum usable number of the cleaning wafers, it is not required to replace the cleaning wafers. In this case, the process proceeds to step S235, and the control unit 20 determines whether or not the replacement of the seasoning wafer is required before the processing of the wafers in the next lot is completed. To be specific, the control unit 20 adds the calculated number of the seasoning wafers required for the next lot to the counted number of the seasoning wafers used, and determines whether or not the result value exceeds the maximum usable number of the seasoning wafers (determining step).

If it is determined that the replacement of the seasoning wafers is required during the next lot processing, the process proceeds to the step S225, and the control unit 20 prohibits start of processing of the corresponding lot (prohibiting step). In the step 230, the replacement of the dummy wafer carrier or the seasoning wafers is performed (replacing step). In the step S240, the start of the processing of the corresponding lot is allowed (processing start allowing step), and this process is completed.

On the other hand, if it is determined that the replacement of the seasoning wafers is not required, the process proceeds to the step S240, and the control unit 20 allows the start of the processing of the corresponding lot (processing start allowing step), and this process is completed.

That is, the number of dummy wafers required to process all the product wafers in the next lot is added to the counted number of the dummy wafers used. Then, if it is determined that the result value exceeds the maximum usable number of the dummy wafers, the start of the next lot processing is prohibited. This can prevent the available dummy wafers in the dummy wafer carrier from being exhausted in the course of the next lot processing, and further can prevent the next lot processing from being stopped to replace the dummy wafer carrier or the dummy wafers.

Accordingly, a temperature in the substrate processing chamber can be kept stable during the lot processing, and uniform plasma processing can be performed on the product wafers in the next lot. As a result, the decrease of the production yield can be avoided.

Example 1 of Allowing Start of Lot Processing

The following is description of a specific example in the case of allowing start of lot processing. In Example 1 of allowing start of lot processing shown in FIGS. 3A to 3C, the number of dummy wafers required to process 25 product wafers of one lot is calculated. For example, when the calculation at the step S210 is executed by the control unit 20 under the conditions described in FIGS. 3A and 3B, it is found that four seasoning wafers in total are required before the lot processing of the substrate processing chambers PM1 to PM4, as can be seen from FIG. 3C.

Since the total used number of PM in each of the substrate processing chambers PM1 to PM4 is four, only one product wafer can be processed in each of the substrate processing chambers PM1 to PM4 after the seasoning process. Then, four cleaning wafers in total are required for the substrate processing chambers PM1 to PM4.

After cleaning each of the substrate processing chambers PM1 to PM4, if an error occurs in the substrate processing chambers PM2 to PM4, product wafers are transferred only to the substrate processing chamber PM1. Therefore, in the substrate processing chamber PM1, a cleaning process is performed by using a single cleaning wafer whenever five product wafers are processed. Herein, the maximum usable number of the dummy wafers is calculated based on a wafer using pattern in which the dummy wafers can be used as many as possible. As a result of the calculation, the control unit 20 determines that four seasoning wafers and eight cleaning wafers are required until 25 product wafers of a next lot are processed.

Under the conditions described in FIGS. 3A and 3B, the cleaning wafers in the slots 18 to 25 in the dummy wafer carrier can be used once, i.e., eight times in total. Further, the seasoning wafers in slots 1 to 4 can be used once, i.e., four times in total. Thus, the replacement of the dummy wafers is not required during the lot processing. Hence, the control unit 20 allows start of the lot processing in the step S240.

Example 2 of Allowing Start of Lot Processing

In Example 2 of allowing start of lot processing shown in FIGS. 4A to 4C, the number of dummy wafers required to process 25 product wafers of a lot A is calculated. Then, the number of dummy wafers required to process 25 product wafers of a lot B is calculated, as can be seen from the transfer route shown in FIG. 4A.

If the calculation of the step S210 is executed by the control unit 20 under the conditions described in FIGS. 4A and 4B, the control unit 20 calculates the number of dummy wafers required for the product wafers of lot A which is transferred to available one of the substrate processing chambers PM1 and PM2 and then calculates the number of dummy wafers required for the product wafers of lot B which are transferred to available one of the substrate processing chambers PM3 and PM4. The result thereof is shown in FIG. 4C.

As a result of the calculation for the lot A, it is found that two seasoning wafers in total are required before processing the lot A with respect to the substrate processing chambers PM1 and PM2. Since the total used number of PM in each of substrate processing chambers PM1 to PM4 is four, only one product wafer can be processed in each of the substrate processing chambers PM1 and PM2 after the seasoning process, and two cleaning wafers in total are required for the substrate processing chambers PM1 and PM2.

After cleaning each substrate processing chamber PM, the substrate processing chambers PM1 and PM2 are cleaned by using a single cleaning wafer whenever five product wafers are processed. As a result of the calculation, the control unit 20 determines that two seasoning wafers and six cleaning wafers are required until 25 product wafers of the lot A are processed.

Next, the calculation for the lot B is carried out. As a result of the calculation, it is found that two seasoning wafers are required before processing the lot B with respect to the substrate processing chambers PM3 and PM4. Since the total used number of PM in each of the substrate processing chambers PM1 to PM4 is four, only one product wafer can be processed in each of the substrate processing chambers PM3 and PM4 after the seasoning process, and two cleaning wafers in total are required for the substrate processing chambers PM3 and PM4.

After cleaning each substrate processing chamber PM, the substrate processing chambers PM3 and PM4 are cleaned by using a single cleaning wafer whenever five product wafers are processed. As a result of the calculation, the control unit 20 determines that two seasoning wafers and six cleaning wafers are required until 25 product wafers of the lot B are processed.

Under the conditions described in FIGS. 4A and 4B, the cleaning wafers in the slots 13 to 25 in the dummy wafer carrier can be used once, i.e., twelve times in total. Further, the seasoning wafers in slots 1 to 4 can be used once, i.e., four times in total. Therefore, the replacement of the dummy wafers is not required during the lot processing. In that case, the control unit 20 allows start of the lot processing in the step S240.

Example 3 of Prohibiting Start of Lot Processing

Hereinafter, a specific example of the case of prohibiting start of lot processing will be explained. In Example 3 of prohibiting start of lot processing shown in FIGS. 5A to 5C, the number of dummy wafers required to process 25 product wafers of one lot is calculated.

If the calculation of the step 210 is performed by the control unit 20 under the conditions described in FIGS. 5A and 5B, four seasoning wafers are required before the lot processing of the substrate processing chambers PM1 to PM4 as shown in FIG. 5C. Since the total used number of PM in each of substrate processing chambers PM1 to PM4 is four, only one product wafer can be processed in the substrate processing chambers PM1 to PM4 after the seasoning process, and four cleaning wafers in total are required for the substrate processing chambers PM1 to PM4.

After cleaning each substrate processing chamber PM, if an error occurs in the substrate processing chambers PM2 to PM4, product wafers are transferred only to the substrate processing chamber PM1 even by the OR transfer method. Therefore, in the substrate processing chamber PM1, a cleaning process is performed by using a single cleaning wafer whenever five product wafers are processed. As a result of the calculation, the control unit 20 determines that four seasoning wafers and eight cleaning wafers are required until 25 product wafers of a next lot are processed.

However, under the conditions of FIG. 5B, the cleaning wafers in the slots 19 to 25 in the dummy wafer carrier can be used only seven times. Therefore, the replacement of the cleaning wafers is required during the lot processing. Accordingly, in this case, the control unit 20 prohibits the start of the lot processing at the step S225, waits for the replacement of the dummy wafer carrier or the dummy wafers at the step S230, and allows the start of the lot processing at the step S240 after the replacement.

Example 4 of Prohibiting Start of Lot Processing

In Example 4 of prohibiting the start of the lot processing shown in FIGS. 6A to 6C, the number of dummy wafers required to process 25 product wafers of a lot C is calculated and, then, the number of dummy wafers required to process 25 product wafers of a lot D is calculated, as can be seen from the transfer route in FIG. 6A.

If the calculation of the step S210 is executed by the control unit 20 under the conditions described in FIGS. 6A and 6B, the control unit 20 calculates the number of dummy wafers required for the product wafers of the lot C which are transferred to available one of the substrate processing chambers PM1 to PM3 and then calculates the number of dummy wafers required for the product wafers of the lot D which are transferred to available one of the substrate processing chambers PM3 and PM4. The result thereof is shown in FIG. 6C.

Three seasoning wafers are required before processing the lot C with respect to the substrate processing chambers PM1 to PM3. Since the total used number of PM in each of substrate processing chambers PM1 to PM3 is four, only one product wafer can be processed in each of the substrate processing chambers PM1 to PM3 after the seasoning process, and three cleaning wafers in total are required for the substrate processing chambers PM1 to PM3.

After cleaning the substrate processing chamber PM, the substrate processing chambers PM1 to PM3 are cleaned by using a single cleaning wafer whenever five product wafers are processed. As a result of the calculation, the control unit 20 determines that three seasoning wafers and six cleaning wafers are required until 25 product wafers of the lot C are processed.

Next, the calculation for the lot D is carried out. Two seasoning wafers in total are required before processing the lot D with respect to the substrate processing chambers PM3 and PM4. The process executed in the substrate processing chamber PM3 may be different between the lot C and the lot D. Therefore, the seasoning process is performed again after processing the lot C in the substrate processing chamber PM3.

Since the total used number of PM in the substrate processing chamber PM3 is three and that in the substrate processing chamber PM4 is four after processing the lot C, it is possible to process two product wafers in the substrate processing chamber PM3 and one product wafer in the substrate processing chamber PM4 after the seasoning process. After the cleaning process, each of the substrate processing chambers PM3 and PM4 is cleaned by using a single cleaning wafer whenever five product wafers are processed. As a result of the calculation, the control unit 20 determines that two seasoning wafers and six cleaning wafers are required until 25 product wafers of the lot D are processed.

Under the conditions described in FIG. 6B, the cleaning wafers in the slots 13 to 25 of the dummy wafer carrier can be used twelve times, and the seasoning wafers in the slots 1 to 4 can be used four times. Therefore, the replacement of the dummy wafer is not required during the processing of the lot C. Accordingly, the control unit 20 allows the start of the processing of the lot C.

Upon completion of the processing of the lot C, only six cleaning wafers in the slots 13 to 25 can be used, and only one seasoning wafer in the slots 1 to 4 can be used. Hence, the replacement of the seasoning wafers is required during the processing of the lot D. Based on the above result, the control unit 20 prohibits the start of the processing of the lot D.

(Alarm)

When the start of the lot processing is prohibited, the control unit 20 displays on a control panel an alarm for alarming replacement of the dummy wafer carrier or the dummy wafers. The alarm may be displayed visually and auditorily. In respond thereto, a system manager replaces the dummy wafer carrier or the dummy wafers in the dummy wafer carrier which have reached the maximum usable number. Accordingly, the next lot processing can be started. Further, the control panel corresponds to a monitor for allowing the system manager to monitor and manage the system.

Alternative Example

The control unit 20 calculates the number of dummy wafers to be used for a next lot again whenever lot processing is completed. For example, in Example 4 of prohibiting the start of the lot processing shown in FIGS. 6A to 6C, the calculation for the lot D is performed again right after the processing of the lot C is completed, and it is determined whether or not the processing of the lot D can be started. For example, when the processing of the lot C and that of the lot D are the same, the seasoning process is not required before starting the processing of the lot D in the substrate processing chamber PM3. In that case, one seasoning wafer and six cleaning wafers are required for the lot D. As a result of the recalculation, the control unit 20 allows the start of the processing of the lot D.

When the start of the processing of the lot D (next lot of the lot C) is prohibited during the processing of the lot C, if the processing of a lot E (waiting lot following the next lot) is in a waiting state, the above calculation for the lot E can be executed. As a result of the calculation, if it is determined that the replacement of the dummy wafers is not required during the processing of the lot E, the control unit 20 allows the start of the processing of the lot E prior to the processing of the lot D.

In the above-described embodiment, the operations of respective units are related and can be changed to a series of operations while considering relationships therebetween. Thus, the embodiment of the control unit for controlling the substrate processing system for performing a lot processing start determining method can be implemented as an embodiment of the lot processing start determining method.

Accordingly, the above-described operations of the control unit 20 can be replaced by the steps of the lot processing start determining method which will be described hereinafter. In other words, the lot processing start determining method in accordance with the present embodiment is performed in a substrate processing system including a substrate processing chamber for performing desired processing on a substrate, a first substrate receiving vessel for receiving product substrates of each lot, and a second substrate receiving vessel for receiving dummy substrates.

The method includes the steps of: storing, in a memory, processing conditions of each lot in the first substrate receiving vessel and a maximum usable number of dummy substrates in the second substrate receiving vessel; counting the used number of the dummy substrates in the second substrate receiving vessel; calculating the number of dummy substrates required to process all the product substrates of a next lot in the first substrate receiving vessel based on the processing conditions of each lot which are stored in the memory, adding the calculated number of the dummy substrates of the next lot to the counted used number of the dummy substrates, and determining whether the added value exceeds the maximum usable number of the dummy substrates stored in the memory; and prohibiting start of processing of the next lot when the added value is determined to exceed the maximum usable number of the dummy substrate, start of processing of the next lot.

While the invention has been shown and described with respect to the embodiments, it will be understood by those skilled in the art that various changes and modification may be made without departing from the scope of the invention as defined in the following claims.

For example, in the present embodiment, the three product wafer carriers LP1 to LP3 and the single dummy wafer carrier LP4 are installed in the substrate processing system 10. However, the number of the carriers is not limited thereto.

Besides, the number of wafers received in the carriers is not limited to 25, and may be set to an arbitrary number.

The numerical values set in parameters, recipes and memories may be set in another storage area. For example, in the above-described embodiment, the use number of PM which is allowed until cleaning is needed is set in parameters; the total used number of PM is set in the memory; the counted used number of dummy wafers is set in the memory; and the number of seasoning wafers is set in the system recipes. Further, the transfer route is set in the system recipe. However, the numerical values set in parameters may be set in the recipes, and the numerical values set in recipes may be set in the parameters.

In addition, an object to be processed in a substrate processing system in accordance with the embodiment of the present invention is not limited to a disc-shaped wafer, and may be a rectangular substrate.

While the invention has been shown and described with respect to the embodiments, it will be understood by those skilled in the art that various changes and modification may be made without departing from the scope of the invention as defined in the following claims.

What is claimed is:

1. A method of determining start of lot processing to be applied in a substrate processing system that includes a substrate processing chamber for performing desired processing on a substrate provided therein, a first substrate receiving vessel for receiving product substrates of each lot and a second substrate receiving vessel for receiving dummy substrates, the method comprising:

a step of storing, in a memory, processing conditions of each lot in the first substrate receiving vessel and a maximum usable number of dummy substrates in the second substrate receiving vessel;

a step of counting a used number of the dummy substrates in the second substrate receiving vessel; and a determining step which includes:
calculating a number of dummy substrates required to process all the product substrates of a next lot in the first substrate receiving vessel based on processing conditions of only the next lot, the processing conditions stored in the memory, adding the calculated number of the dummy substrates required to process all the product substrates of the next lot to the counted used number for the dummy substrates to find an added value, and determining whether the added value exceeds the maximum usable number of the dummy substrates stored in the memory.

2. The method of claim 1, further comprising: if the added value exceeds the maximum usable number of the dummy substrates stored in the memory, prohibiting start of processing the next lot and replacing the second substrate receiving vessel or the dummy substrates in the second substrate receiving vessel after processing of a current lot is completed.

3. The method of claim 1, further comprising, if it is determined that the added value exceeds the maximum usable number:
a deciding step which includes:
computing the number of dummy substrates required to process all the product substrates of the next lot based on considering additional processing conditions for a current lot and the next lot;
summing the computed number of the dummy substrates for processing the next lot and the counted used number of the dummy substrates to find a summed value and deciding whether the summed value exceeds the maximum usable number of the dummy substrates stored in the memory; and
a step of allowing start of processing the next lot if the summed value does not exceed the maximum usable number of the dummy substrates stored in the memory.

4. The method of claim 3, further comprising, if it is determined that the summed value exceeds the maximum usable number:
a choosing step which includes:
computing a number of the dummy substrates required to process a waiting lot following the next lot;
summing the computed number of the dummy substrates for processing the waiting lot and the counted used number of the dummy substrates to obtain a summed number, and
finding whether the summed number exceeds the maximum usable number of the dummy substrates stored in the memory; and
a step of starting a processing of the waiting lot prior to a processing of the next lot if the summed number is determined not to exceed the maximum usable number of the dummy substrates stored in the memory.

5. The method of claim 4, wherein the determining step is carried out during processing of the current lot and the deciding step is carried out after the processing of the current lot is completed, and wherein the start of processing the next lot is prohibited if the summed value exceeds the maximum usable number of the dummy substrates stored in the memory.

6. The method of claim 5, wherein if the start of processing the next lot is prohibited, an alarm indicating that the start of processing the next lot is prohibited is displayed on a monitor.

7. The method of claim 3, wherein, the calculated number of the dummy substrates obtained in the determining step is a maximum number of dummy substrates expected to be required to process all the product substrates in the next lot without considering the processing conditions of the current lot.

8. The method of claim 3, wherein the dummy substrates include at least one of a cleaning substrate or a seasoning substrate.

9. The method of claim 3, further comprising, if the summed value exceeds the maximum usable number of the dummy substrates stored in the memory, prohibiting the start of processing the next lot and comprising replacing the second substrate receiving vessel or the dummy substrates in the second substrate receiving vessel after processing of the current lot is completed.

10. The method of claim 3, wherein the determining step is carried out during processing of the current lot and the deciding step is carried out after the processing of the current lot is completed, and wherein the start of processing the next lot is prohibited if the summed value exceeds the maximum usable number of the dummy substrates stored in the memory.

11. The method of claim 10, wherein if the start of processing the next lot is prohibited, an alarm indicating that the start of processing the next lot is prohibited is displayed on a monitor.

12. The method of claim 1, further comprising, if it is determined that the added value exceeds the maximum usable number:
a choosing step which includes:
computing a number of the dummy substrates required to process a waiting lot following the next lot;
summing the computed number of the dummy substrates for processing the waiting lot and the counted used number of the dummy substrates to obtain a summed number, and
finding whether the summed number exceeds the maximum usable number of the dummy substrates stored in the memory; and
a step of starting a processing of the waiting lot prior to a processing of the next lot if the summed number is determined not to exceed the maximum usable number of the dummy substrates stored in the memory.

13. The method of claim 12, wherein, the calculated number of the dummy substrates obtained in the determining step is a maximum number of dummy substrates expected to be required to process all the product substrates in the next lot without considering additional processing conditions of a current lot.

14. The method of claim 12, further comprising, if the summed number exceeds the maximum usable number of the dummy substrates stored in the memory, prohibiting start of processing the next lot and comprising replacing the second substrate receiving vessel or the dummy substrates in the second substrate receiving vessel after processing of a current lot is completed.

15. The method of claim 1, wherein, the calculated number of the dummy substrates obtained in the determining step is a maximum number of dummy substrates expected to be required to process all the product substrates in the next lot without considering additional processing conditions of a current lot.

16. The method of claim 15, further comprising, if the added value exceeds the maximum usable number of the dummy substrates stored in the memory, prohibiting start of processing the next lot and comprising replacing the second substrate receiving vessel or the dummy substrates in the second substrate receiving vessel after processing of a current lot is completed.

17. The method of claim 1, wherein the dummy substrates include at least one of a cleaning substrate or a seasoning substrate.

18. The method of claim 1, wherein the used number of the dummy substrates is a sum of a used number of each dummy substrate in the second substrate receiving vessel, and
wherein the maximum usable number of the dummy substrates is a sum of a usable number of each dummy substrate in the second substrate receiving vessel.

19. A control unit for controlling a substrate processing system that includes a substrate processing chamber for performing desired processing on a substrate, a first substrate receiving vessel for receiving product substrates of each lot, and a second substrate receiving vessel for receiving dummy substrates, wherein the control unit performs operations including:
a step of storing, in a memory, processing conditions of each lot in the first substrate receiving vessel and a maximum usable number of dummy substrates in the second substrate receiving vessel;

a step of counting a used number of the dummy substrates in the second substrate receiving vessel; and a determining step which includes:
- calculating a number of dummy substrates required to process all the product substrates of a next lot in the first substrate receiving vessel based on processing conditions of only the next lot which are stored in the memory,
- adding the calculated number of the dummy substrates required to process all the product substrates of the next lot to the counted used number for the dummy substrates to find an added value, and
- determining whether the added value exceeds the maximum usable number of the dummy substrates stored in the memory.

20. The control unit of claim 19, wherein the used number of the dummy substrates is a sum of a used number of each dummy substrate in the second substrate receiving vessel, and wherein the maximum usable number of the dummy substrates is a sum of a usable number of each dummy substrate in the second substrate receiving vessel.

* * * * *